United States Patent [19]
Sato

[11] Patent Number: 5,736,775
[45] Date of Patent: Apr. 7, 1998

[54] SEMICONDUCTOR DEVICE HAVING A CONCENTRATION PEAK POSITION COINCIDING WITH A CHANNEL STOPPER

[75] Inventor: Natsuki Sato, Tokyo, Japan

[73] Assignee: NEC Corporation, Tokyo, Japan

[21] Appl. No.: 585,993

[22] Filed: Jan. 11, 1996

[30] Foreign Application Priority Data

Jan. 9, 1995 [JP] Japan ................. 7-001370

[51] Int. Cl.$^6$ ................. H01L 29/76; H01L 29/94
[52] U.S. Cl. ................. 257/509; 257/398; 257/399; 257/400
[58] Field of Search ................. 257/336, 344, 257/509, 408, 400, 411, 301, 304, 332, 371, 374, 396, 657, 519, 547, 511, 398, 399; 437/70, 69, 26, 45, 913, 30, 154

[56] References Cited

U.S. PATENT DOCUMENTS

| | | |
|---|---|---|
| 5,206,535 | 4/1993 | Namsoe ................. 257/519 |
| 5,348,910 | 9/1994 | Namsoe ................. 437/70 |
| 5,428,239 | 6/1995 | Okumura et al. ................. 257/371 |
| 5,478,759 | 12/1995 | Mametani et al. ................. 437/30 |
| 5,508,541 | 4/1996 | Hieda et al. ................. 257/301 |
| 5,554,871 | 9/1996 | Yamashita et al. ................. 257/336 |
| 5,594,264 | 1/1997 | Shirahata et al. ................. 257/335 |

Primary Examiner—Carl W. Whitehead

[57] ABSTRACT

A semiconductor device includes a field insulating film, a channel stopper, and a diffusion layer. The field insulating film is formed on one major surface of a semiconductor substrate of a first conductivity type to surround an element region. The channel stopper of the first conductivity type is formed immediately below the field insulating film. The diffusion layer of an opposite conductivity type is formed to be adjacent to the channel stopper. The impurity concentration peak position of the diffusion layer substantially coincides with that of the channel stopper.

8 Claims, 12 Drawing Sheets

SEMICONDUCTOR DEVICE HAVING A CONCENTRATION PEAK POSITION COINCIDING WITH A CHANNEL STOPPER

BACKGROUND OF THE INVENTION

1. Field of the Invention

The present invention relates to a semiconductor device and a method of manufacturing the same and, more particularly, to a semiconductor device having a contact with a small leakage current at a portion near a channel stopper immediately below a field oxide film serving as an element isolation region, and a method of manufacturing the same.

2. Description of the Prior Art

With advances in the miniaturization of integrated circuit devices formed in semiconductor substrates, demands have arisen for micropatterning and higher integration of elements. As a result, it is also required that the distance between elements, i.e., the width of a field oxide film serving as an element isolation region, be 0.5 μm or less. As the element isolation region decreases in size, the isolation function deteriorates. As a result, a punch-through phenomenon occurs between elements to cause leakage of a current. As a conventional means for solving this problem, a method of forming an impurity region having the same conductivity type as a semiconductor substrate immediately below the field oxide film, and increasing the impurity concentration of only this portion of the substrate has been used. FIGS. 1A to 1E show a conventional device using this method. FIGS. 1A to 1E are sectional views showing the steps in manufacturing a dynamic RAM cell constituted by a MOS capacitor and a MOS transistor.

As shown in FIG. 1A, a 500-nm thick field oxide film 2 serving as an element isolation region is formed on a p-type semiconductor substrate 1 by a known method. More specifically, this region is formed by a so-called LOCOS method or the like in which an element formation region is masked with an oxidation-resistant mask member, e.g., a silicon nitride film, and thermal oxidation is performed while only the element formation region is exposed. A $p^+$-type channel stopper 3 is formed immediately below the element isolation region to prevent the above punch-through phenomenon, i.e., current leakage between elements. This stopper may be formed by implanting phosphorus ions into a field oxide film formation region by using the above silicon nitride film as a mask before the field oxide film 2 is formed by thermal oxidation. Alternatively, the stopper may be formed by implantation of phosphorus ions, after the formation of the field oxide film 2, while the implantation energy is adjusted such that the ions pass through the field oxide film 2 and exhibit a concentration peak immediately below the field oxide film 2. The field oxide film 2 and the $p^+$-type channel stopper 3 are formed by these methods. After a gate oxide film having a thickness of 10 to 15 nm is formed in the element region surrounded by the field oxide film 2, a 200-nm thick $n^+$-type polysilicon film is deposited on the resultant structure. The $n^+$-type polysilicon film is then etched by a known photolithographic technique to pattern a gate electrode 9 (word line). After the gate electrode 9 and the field oxide film 2 are masked, phosphorus ions are implanted at a dose of $3\times10^{13}$ cm$^{-2}$ to form n-type diffusion layers 4. The junction depth of these n-type diffusion layers 4 is set to be about 0.07 μm. The n-type diffusion layers 4 serve as the source and drain regions of a MOS transistor.

For example, a 500-nm thick silicon oxide film serving as an insulating film 5 is deposited on the resultant structure. Thereafter, as shown in FIG. 1B, a contact portion 6 is formed by using a photoresist (not shown) as a mask to reach the n-type diffusion layer 4. As shown in FIG. 1C, n-type polysilicon is deposited on the insulating film 5 and the contact portion 6, and is patterned to form a storage electrode on the contact portion 6, thereby forming a storage electrode 10 of a capacitor. The resultant structure is then annealed to thermally diffuse the impurity from the storage electrode 10 consisting of n-type polysilicon into the p-type semiconductor substrate 1, in which the n-type diffusion layers 4 are formed, through the contact portion 6, thereby forming an $n^+$-type diffusion layer 11, as shown in FIG. 1D. Note that the n-type storage electrode 10 may be formed by depositing undoped polysilicon, patterning it, and diffusing an impurity such as phosphorus. If this method is used, the $n^+$-type diffusion layer 11 is formed at the same time phosphorus as an impurity is diffused. After this step, as shown in FIG. 1E, a capacitance insulating film 13 having a thickness of 3 to 5 nm (as a silicon oxide film) is formed on the upper and side surfaces of the storage electrode 10, and a plate electrode 14 is formed by using a 200-nm thick n-type polysilicon film. The capacitance portion of a dynamic RAM cell is formed in the above manner. When a wiring layer (not shown) serving as a bit line is formed on this structure, a dynamic RAM cell is completed. The capacitance portion is formed by the above method to have a structure in which the n-type diffusion layer 4 and the $n^+$-type diffusion layer 11 are integrated into an $n^+$-type diffusion layer 20. The charge stored in the storage electrode 10 is transferred from the $n^+$-type diffusion layer 20 to the n-type diffusion layer 4 upon ON/OFF operation of the gate electrode 9 of the MOS transistor, thus inputting/outputting data.

In the case of the contact having the arrangement described with reference to the above conventional device, the $n^+$-type diffusion layer 20 is formed near the field oxide film 2 with advances in the micropatterning of elements. For this reason, the $n^+$-type diffusion layer 20 contacts the $p^+$-type channel stopper 3, and a $p^+$-$n^+$ junction portion 21 is formed therebetween. FIG. 2 shows the impurity concentration profile of the $p^+$-$n^+$ junction portion 21. The profile of the $p^+$-type channel stopper 3 exhibits a concentration peak at a depth of about 0.11 μm and a concentration of about $5\times10^{17}$ cm$^{-3}$. In contrast to this, the profile of the $n^+$-type diffusion layer 20 exhibits a concentration peak at the substrate surface and a concentration of about $5\times10^{18}$ cm$^{-3}$. As shown in FIG. 2, therefore, the $p^+$-$n^+$ junction portion 21 is formed at a depth of about 0.08 to 0.09 μm. However, neither of the $p^+$- and $n^+$-type impurity concentrations of the $p^+$-$n^+$ junction portion 21 are peak values. That is, the $p^+$-$n^+$ junction portion 21 is formed at a depth where the impurity concentrations are insufficient. As a result, when a potential is applied to the $p^+$-$n^+$ junction portion 21, a depletion layer extends to both the $p^+$- and $n^+$-type impurity sides. If the depletion layer extends to the $n^+$-type impurity side, in particular, a G-R center (generation and recombination center) in the $n^+$-type diffusion layer 20 enters the extended depletion layer. The resultant layer serves as a leak path, so that the stored charge leaks to the substrate side. If the amount of the impurity diffused from the storage electrode 10 is increased to compensate for the concentration of the $p^+$-type channel stopper 3 so as to prevent this leakage of charge, the $n^+$-type diffusion layer 20 spreads in not only the direction of depth but also the lateral direction. As a result, the distance from another adjacent $n^+$-type diffusion layer decreases. Consequently, the withstand voltage between the $n^+$-type diffusion layers decreases, and leakage of charge occurs.

SUMMARY OF THE INVENTION

The present invention has been made in consideration of the above situation in the prior art, and has its first object to provide a semiconductor device in which the current leakage characteristics of a diffusion layer in a contact region are improved, and a method of manufacturing the same.

It is the second object of the present invention to provide a semiconductor device which can realize both an increase in storage capacitance and a decrease in leakage current when the device is used as the storage electrode of a capacitor, and a method of manufacturing the same.

In order to achieve the above objects, according to the first aspect of the present invention, there is provided a semiconductor device comprising a field insulating film formed on one major surface of a semiconductor substrate of a first conductivity type to surround an element region, a channel stopper of the first conductivity type formed immediately below the field insulating film, and a diffusion layer of an opposite conductivity type formed to be adjacent to the channel stopper, wherein an impurity concentration peak position of the diffusion layer substantially coincides with that of the channel stopper.

According to the second aspect of the present invention, in the semiconductor device according to the first aspect, the semiconductor substrate is formed into a structure having a well formed in one major surface.

According to the third aspect of the present invention, there is provided a semiconductor device comprising an element isolation region formed on one major surface of a semiconductor substrate of a first conductivity type, a channel stopper of the first conductivity type formed immediately below the element isolation region, an element formation region formed to be surrounded by the element isolation region, a first impurity region formed in the element formation region, an insulating film formed on the one major surface of the semiconductor substrate, a contact portion formed to reach the first impurity region, a second impurity region in a region, on the semiconductor substrate, in which the contact portion is formed, a first conductive layer connected to the first and second impurity regions and formed in the contact portion, and a third impurity region formed by diffusing an impurity from the first conductive layer into the semiconductor substrate, wherein the first, second, and third impurity regions are adjacent to the channel stopper, and an impurity profile of the second impurity region exhibits a concentration peak at substantially the same depth as that at which an impurity profile of the channel stopper exhibits a concentration peak.

According to the fourth aspect of the present invention, in the semiconductor device according to the third aspect, an impurity concentration of the second impurity region is at least not less than three times that of the channel stopper.

According to the fifth aspect of the present invention, there is provided a semiconductor device comprising an element isolation region formed on one major surface of a semiconductor substrate of a first conductivity type, a channel stopper of the first conductivity type formed immediately below the element isolation region, an element formation region formed to be surrounded by the element isolation region, a first impurity region formed in the element formation region, a contact portion formed to reach the first impurity region, a second impurity region in a region, on the semiconductor substrate, in which the contact portion is formed, a first conductive layer connected to the first and second impurity regions and formed in the contact portion, a third impurity region formed by diffusing an impurity from the first conductive layer into the semiconductor substrate, an insulating film formed on the one major surface of the semiconductor substrate, a second conductive layer formed on the insulating film, and a fourth impurity region formed in the second conductive layer, wherein the first, second, and third impurity regions are adjacent to the channel stopper, an impurity profile of the second impurity region exhibits a concentration peak at substantially the same depth as that at which an impurity profile of the channel stopper exhibits a concentration peak, and a cross-section of a side wall portion of the second conductive layer has a wedge-shaped constriction.

According to the sixth aspect of the present invention, in the semiconductor device according to the fifth aspect, an impurity concentration of the second impurity region is at least not less than three times that of the channel stopper.

According to the seventh and eighth aspects of the present invention, in the semiconductor device according to the fifth and sixth aspects, the fourth impurity region formed in the second conductive layer has an oxygen-rich region in at least one of positions immediately above or below the fourth impurity region, and the second conductive layer has a multilayered structure constituted by the fourth impurity region and the oxygen-rich region.

According to the ninth aspect of the present invention, there is provided a method of manufacturing a semiconductor device, comprising the steps of forming a field insulating film on one major surface of a semiconductor substrate of a first conductivity type to surround an element region, and a channel stopper of the first conductivity type immediately below the field insulating film, forming an insulating film on the element region, forming a polysilicon layer on the insulating film, forming an opening portion in the insulating film to expose the semiconductor substrate, forming a diffusion layer of an opposite conductivity type to be adjacent to the channel stopper, and implanting impurity ions of the opposite conductivity type into the polysilicon layer and the exposed portion of the semiconductor substrate such that an impurity concentration peak position of the diffusion layer substantially coincides with that of the channel stopper.

According to the 10th aspect of the present invention, there is provided a method of manufacturing a semiconductor device, comprising the steps of forming an element isolation region on one major surface of a semiconductor substrate of a first conductivity type, forming an element formation region to be surrounded by the element isolation region, forming a channel stopper of the first conductivity type immediately below the element isolation region, forming a first impurity region by implanting ions into the element formation region, forming an insulating film on the one major surface of the semiconductor substrate, forming a contact portion to reach the first impurity region, forming a second impurity region in a region, on the semiconductor substrate, in which the contact portion is formed, forming a first conductive layer in the contact portion to be connected to the first and second impurity regions, and forming a third impurity region by diffusing an impurity from the first conductive layer into the semiconductor substrate, wherein the first, second, and third impurity regions are adjacent to the channel stopper, and an impurity profile of the second impurity region exhibits a concentration peak at substantially the same depth as that at which an impurity profile of the channel stopper exhibits a concentration peak.

According to the 11th aspect of the present invention, in the method of manufacturing a semiconductor device according to the 10th aspect, the second impurity region is formed by ion implantation, and the third impurity region is formed by thermal diffusion of an impurity.

According to the 12th aspect of the present invention, there is provided a method of manufacturing a semiconductor device, comprising the steps of forming an element isolation region on one major surface of a semiconductor substrate of a first conductivity type, forming an element formation region to be surrounded by the element isolation region, forming a channel stopper of the first conductivity type immediately below the element isolation region, forming a first impurity region in the element formation region, forming an insulating film on the one major surface of the semiconductor substrate, forming a second conductive layer on the insulating film, forming a contact portion to reach the first impurity region, forming a second impurity region in a region, on the semiconductor substrate, in which the contact portion is formed, and at the same time, forming a fourth impurity region in the second conductive layer, forming a first conductive layer in the contact portion to be connected to the first and second impurity regions, forming a third impurity region by diffusing an impurity from the first conductive layer into the semiconductor substrate, and masking the first conductive layer, and performing a combination of isotropic etching and anisotropic etching to cause a cross-section of a side wall portion of the second conductive layer to have a wedge-shaped constriction, wherein the first, second, and third impurity regions are adjacent to the channel stopper, and an impurity profile of the second impurity region exhibits a concentration peak at substantially the same depth as that at which an impurity profile of the channel stopper exhibits a concentration peak.

According to the 13th aspect of the present invention, in the method of manufacturing a semiconductor device according to the 12th aspect, the second and fourth impurity regions are formed by ion implantation, and the third impurity region is formed by thermal diffusion of an impurity.

According to the 14th and 15th aspects of the present invention, the method of manufacturing a semiconductor device according to the 12th and 13th aspects further comprises the step of alternately repeating the step of forming an oxygen-rich region by mixing oxygen in a deposition reactive gas in the process of depositing the second conductive layer on the insulating film, and the step of forming the second conductive layer without mixing oxygen.

According to the present invention, as is understood from the respective aspects described above, a diffusion layer exhibiting an impurity profile peak at substantially the same depth as that at which a channel stopper exhibits an impurity profile peak is formed by performing ion implantation at a dose set such that the impurity concentration is at least three times or more that of the channel stopper, an electrode is then formed, and a thin diffusion layer is also formed on a contact surface by impurity diffusion from the electrode, with a depletion layer in a $p^+$-$n^+$ junction extending to the $n^+$-type impurity side, thereby providing a semiconductor device having a contact with a small amount of leakage current owing to a structure in which a G-R center in an $n^+$-type diffusion layer is outside the depletion layer, and a method of manufacturing the same.

In addition, according to the present invention, ions are also implanted into the second conductive layer in the above ion implantation step to form a heavily-doped region, and etching is performed at different etching rates depending on impurity concentrations in the step of etching the electrode to form the electrode into a shape having a wedge-shaped constriction, thereby providing a semiconductor device which can realize both an increase in storage capacitance and a decrease in the amount of leakage current without increasing the number of steps in the manufacturing process when the device is used as the storage electrode of a capacitor, and a method of manufacturing the same.

The above and many other advantages, features and additional objects of the present invention will become manifest to those versed in the art upon making reference to the following detailed description and accompanying drawings in which preferred structural embodiments incorporating the principles of the present invention are shown by way of illustrative examples.

DETAILED DESCRIPTION OF THE PREFERRED EMBODIMENTS

Figure 3A:
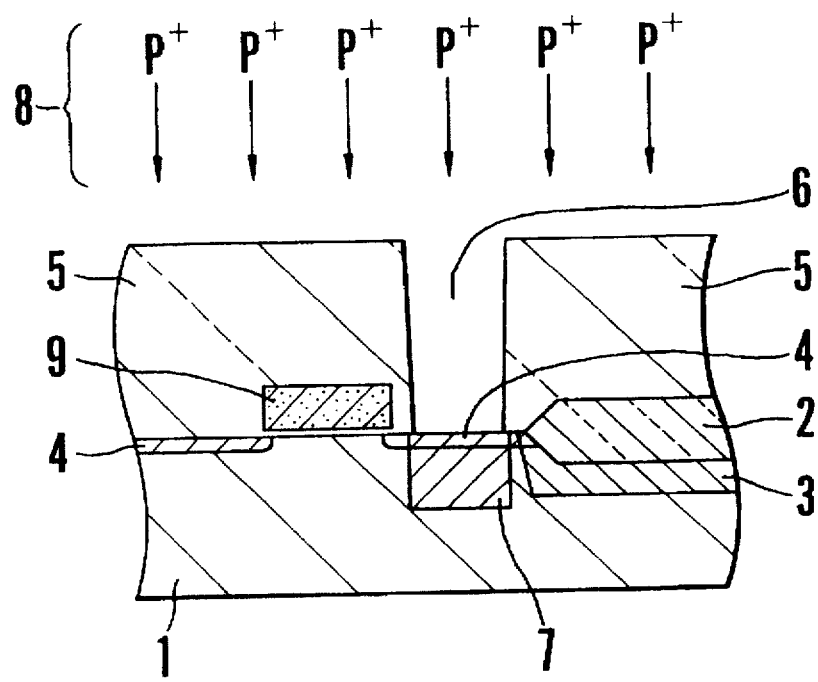
FIGS. 3A to 3D are partial sectional views showing the steps in manufacturing a semiconductor device according to the first embodiment of the present invention.
Figure 3B:
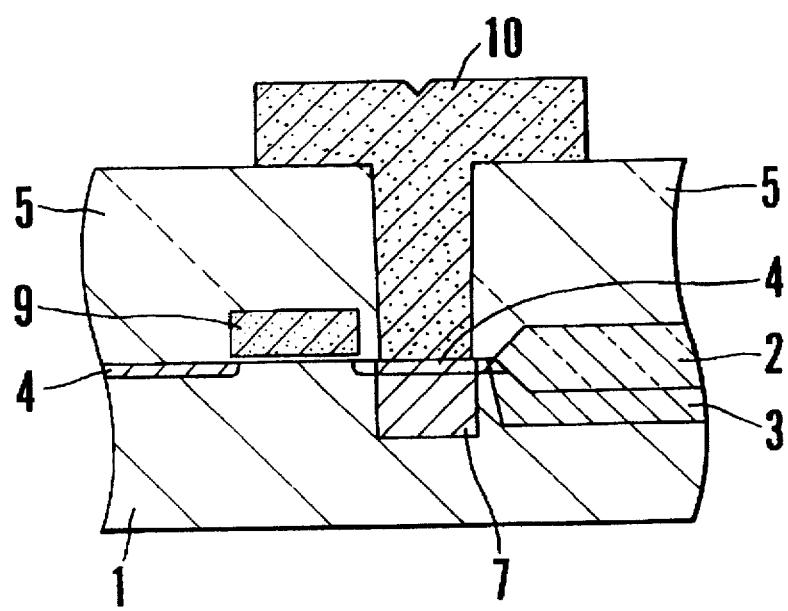
Figure 3C:
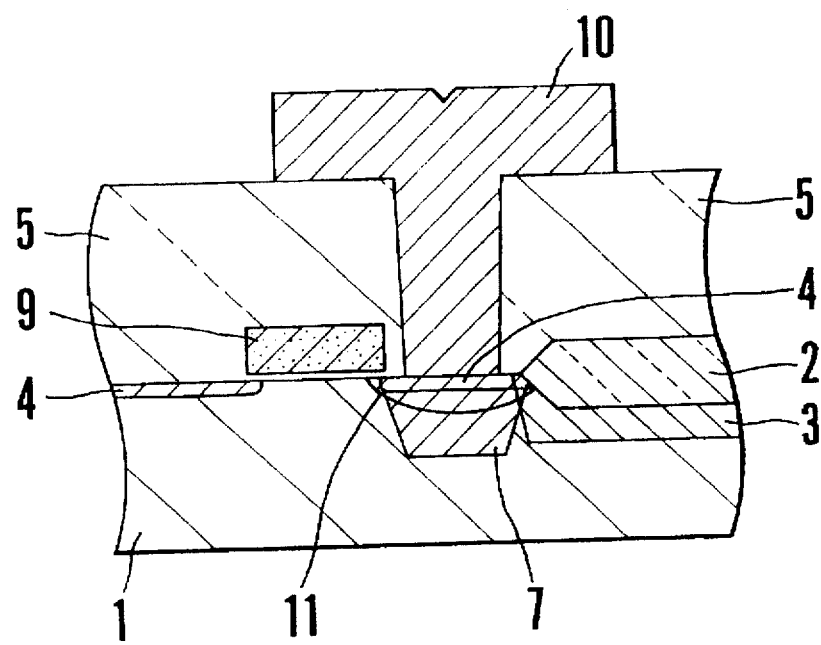
Figure 3D:
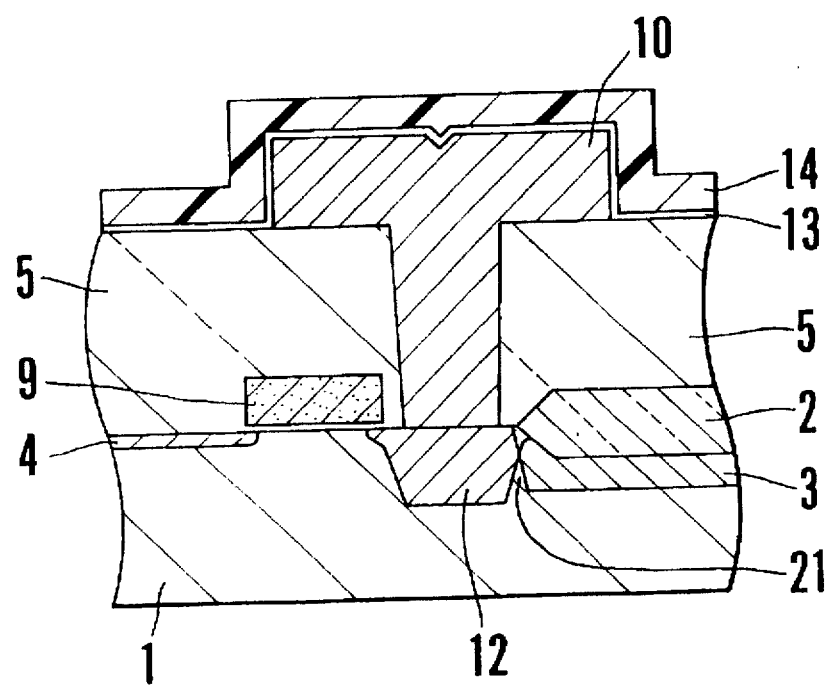
Figure 4:
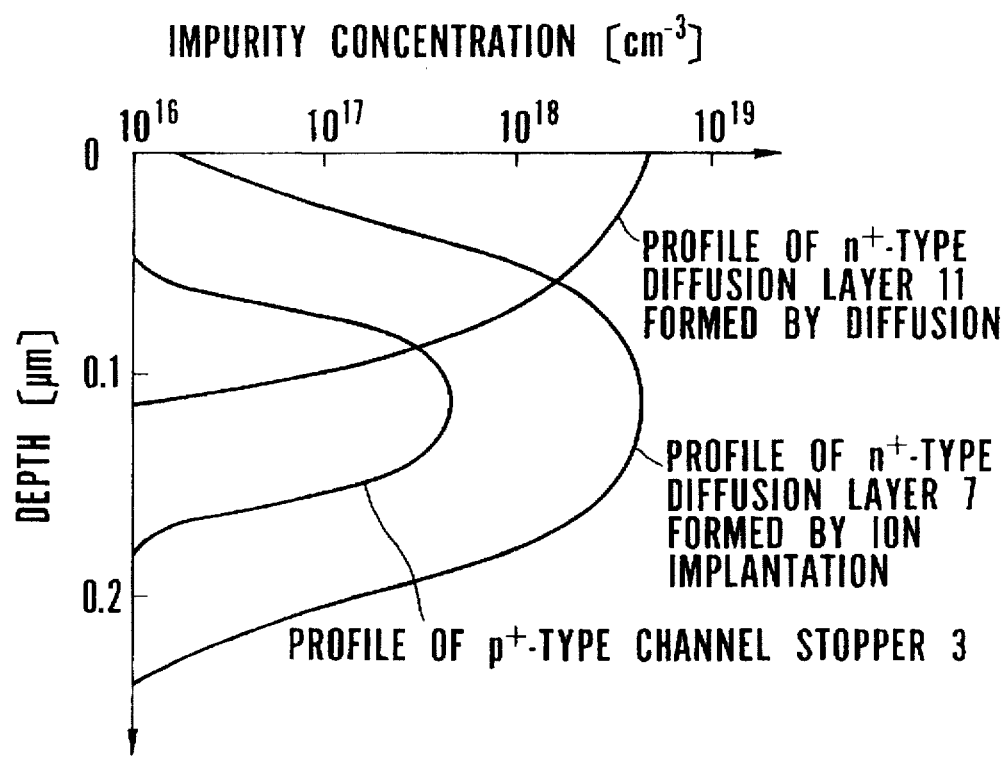
FIG. 4 is a graph showing the impurity concentration profile of an $n^+$-type diffusion layer in the first embodiment in FIG. 3D.

Several preferred embodiments of the present invention will be described below with reference to the accompanying drawings. FIGS. 3A to 3D are sectional views for explaining the first embodiment of the present invention. FIGS. 6A to 6F are sectional views for explaining the second embodiment of the present invention. FIGS. 7A to 7F are sectional views for explaining the third embodiment of the present invention. FIGS. 3A to 3D are partial sectional views showing changes in the structure of a dynamic RAM cell constituted by a MOS capacitor and a MOS transistor in the order of the manufacturing process. FIG. 3D shows the structure of a completed dynamic RAM cell. Referring to FIG. 3D, an element formation region is surrounded by a field oxide film 2 formed as an element isolation region on a p-type semiconductor substrate 1, and a $p^+$-type channel stopper 3 is formed immediately below the field oxide film 2. An n-type diffusion layer 4 as the first impurity region and an $n^+$-type diffusion layer 12 are formed to sandwich a gate electrode 9 of the MOS transistor. Note that the n-type diffusion layer 4 and the $n^+$-type diffusion layer 12 respectively serve as source and drain regions. The $n^+$-type diffusion layer 12 is formed at a depth in the p-type semiconductor substrate 1 deeper than the $p^+$-type channel stopper 3. The $n^+$-type diffusion layer 12 has an impurity concentration three times or more higher than that of the $p^+$-type channel stopper 3. The position of the peak of the impurity concentration profile of the $n^+$-type diffusion layer 12 in the direction of depth substantially coincides with that of the p⁺-type channel stopper 3. FIG. 4 shows this state in detail. Data is read/written in/from a storage electrode 10 by ON/OFF-controlling the gate electrode 9 of the MOS transistor. The storage electrode 10 is connected to the n⁺-type diffusion layer 12 via a contact portion 6. A capacitance portion is constituted by the storage electrode 10, a capacitance insulating film 13, and a plate electrode 14.

Referring to FIG. 4, the profile of the p⁺-type channel stopper 3 exhibits a concentration peak at a depth of about 0.11 μm and a concentration of about $5\times10^{17}$ cm⁻³. The n⁺-type diffusion layer 12 is formed by synthesizing the two impurity profiles of an n⁺-type diffusion layer 11 formed as the third impurity region by thermal diffusion and an n⁺-type diffusion layer 7 formed as the second impurity region by ion implantation. The n⁺-type diffusion layer 11 formed by thermal diffusion has a concentration peak on the substrate surface and a concentration of about $5\times10^{18}$ cm⁻³. The n⁺-type diffusion layer 7 formed by ion implantation has a concentration peak at a depth of about 0.11 μm and a concentration of about $5\times10^{18}$ cm⁻³. With this structure, the p⁺- and n⁺-type impurities in a p⁺-n⁺ junction portion 21 differ in concentration from each other by 10 times so a depletion layer extends to the p⁺-type impurity side but hardly extends to the n⁺-impurity side upon application of a potential in this embodiment. No leakage current therefore flows through the G-R center in the n⁺-type diffusion layer 20, and a good contact is formed. In addition, if the present invention is used as the contact of the storage electrode 10 of the memory cell as in this embodiment, excellent charge holding characteristics can be obtained, and hence a highly reliable dynamic RAM can be realized.

Figure 1A:
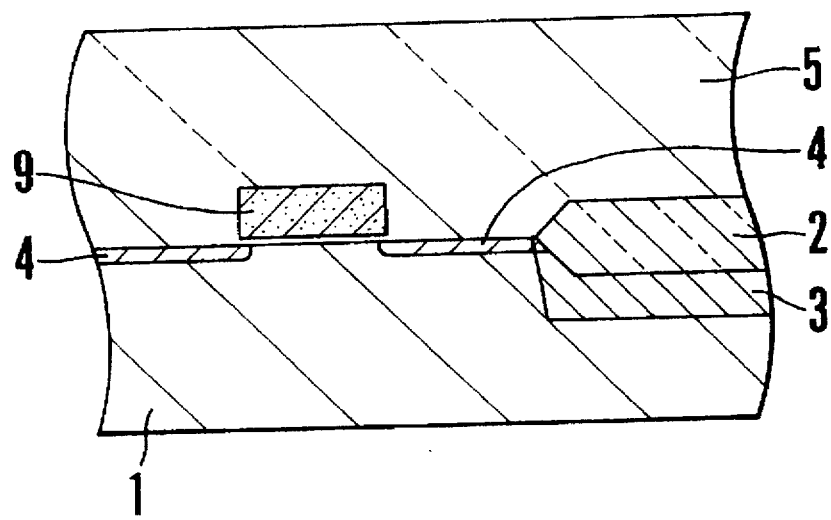
FIGS. 1A to 1E are partial sectional views showing the steps in manufacturing a conventional semiconductor device.
Figure 1B:
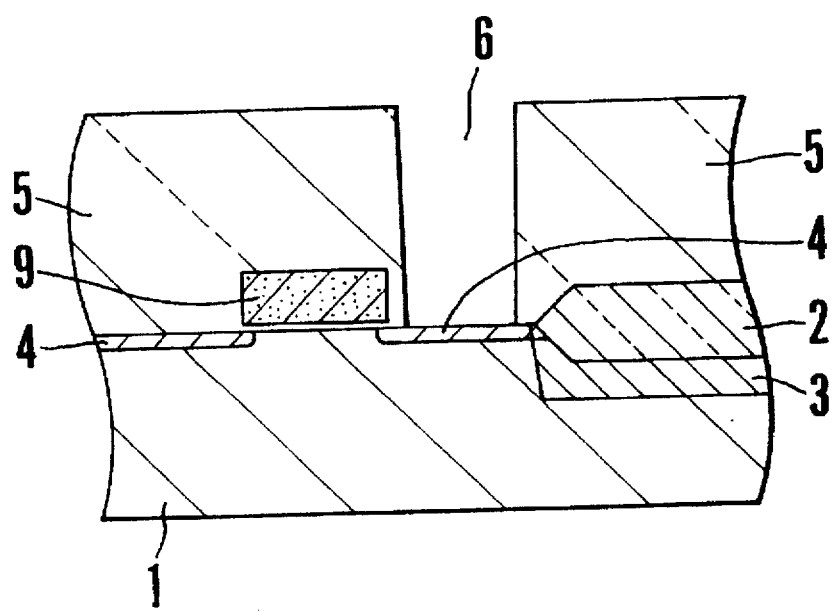
Figure 1C:
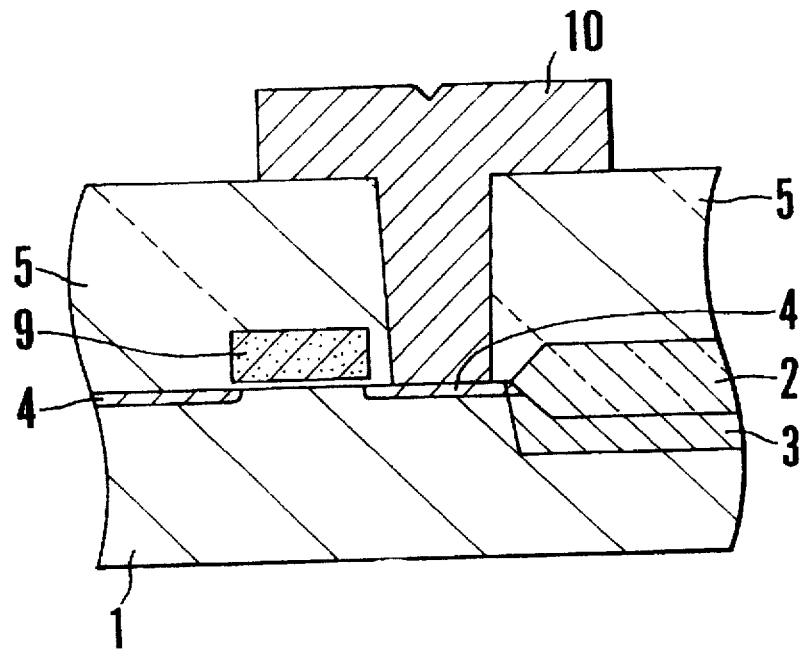
Figure 1D:
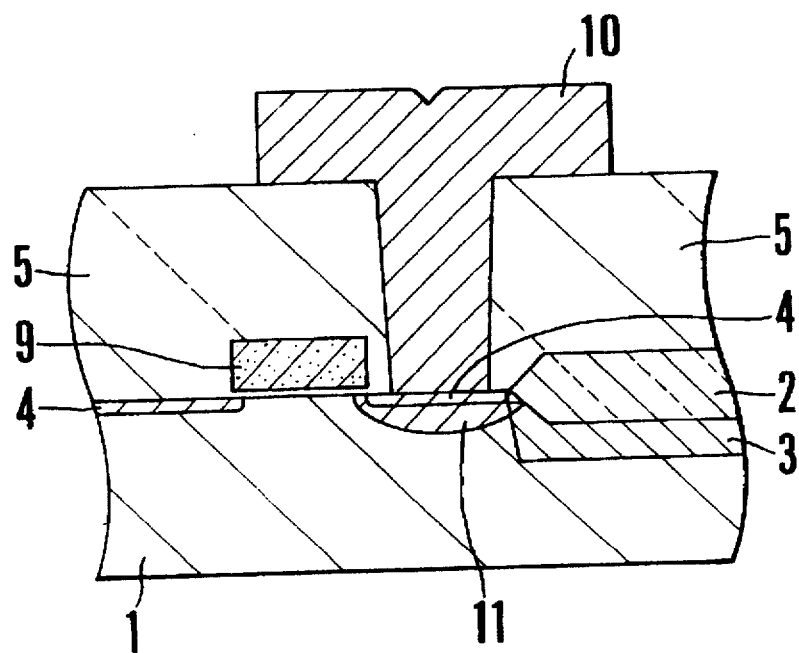
Figure 1E:
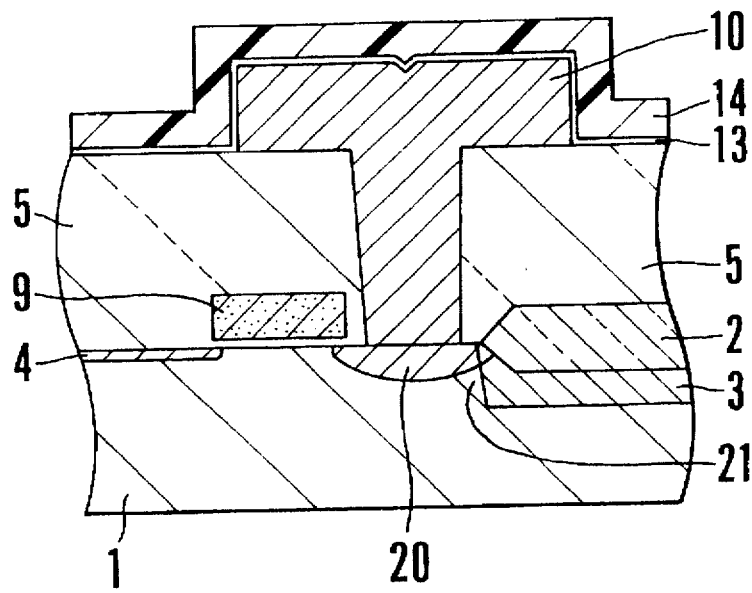
Figure 2:
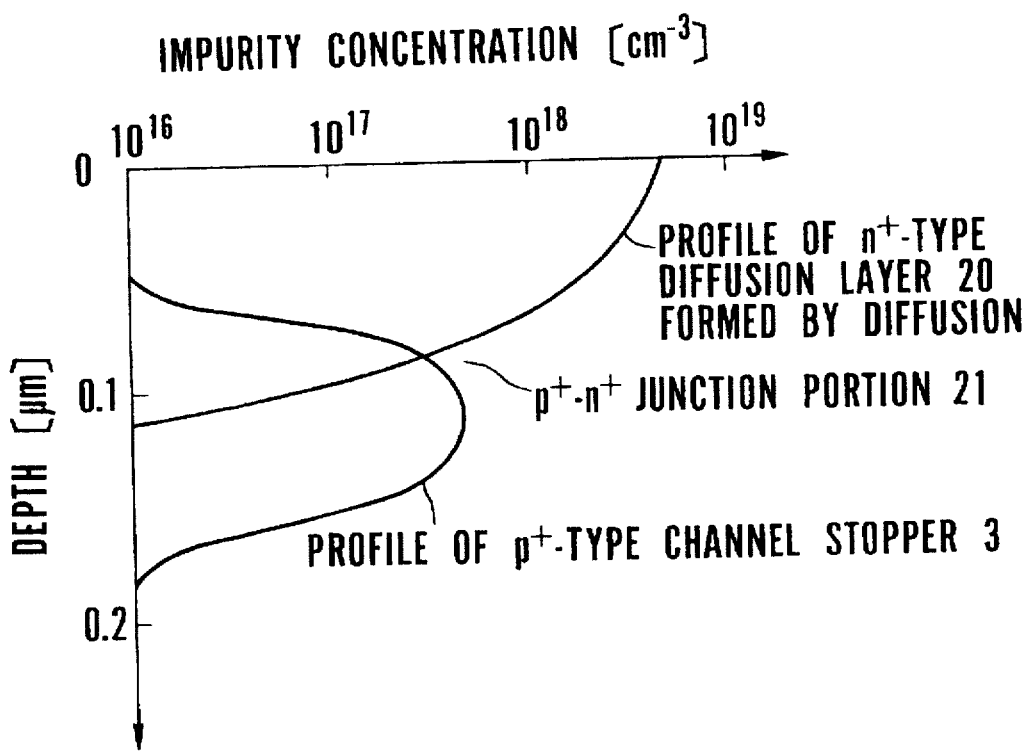
FIG. 2 is a graph showing the impurity concentration profile of an $n^+$-type diffusion layer in the conventional device in FIG. 1E.

A method of manufacturing the dynamic RAM cell having the structure shown in FIG. 3D will be described next. First of all, a field oxide film 2, a p⁺-type channel stopper 3, an n-type diffusion layer 4, an insulating film 5, and a contact portion 6 are formed in/on a p-type semiconductor substrate 1 by the same method as that shown in FIGS. 1A and 1B. As shown in FIG. 3A, phosphorus ions 8 are then implanted into the entire surface of the resultant structure to form an n⁺-type diffusion layer 7 as the second impurity region. In this ion implantation, the implantation energy and the dose are determined to realize an ion implantation depth of about 0.11 μm and a concentration of $5\times10^{18}$ cm⁻³. As shown in FIG. 3B, n-type polysilicon is deposited on the entire surfaces of the insulating film 5 and the contact portion 6 to a depth of 400 nm, and patterning is performed to form a storage electrode 10 on the contact portion 6. With this step, the storage electrode 10 of the capacitor is formed. As shown in FIG. 3C, the resultant structure is annealed to thermally diffuse the impurity from the storage electrode 10 consisting of n-type polysilicon into the p-type semiconductor substrate 1, in which the n⁺-type diffusion layer 7 is formed, via the contact portion 6. With this step, an n⁺-type diffusion layer 11 as the third impurity region is formed. Note that the storage electrode 10 may be formed by depositing undoped polysilicon, patterning it, and diffusing an impurity such as phosphorus. In this case, an n-type storage electrode is formed. If this method is used, the n⁺-type diffusion layer 11 can be formed at the same time phosphorus as an impurity is diffused. In addition, when annealing is performed to form the n⁺-type diffusion layer 11, the previously formed n⁺-type diffusion layer 7 also undergoes thermal diffusion. As shown in FIG. 3D, a capacitance insulating film 13 having a thickness of 3 to 5 nm (as a silicon oxide film) is formed on the upper and side surfaces of the storage electrode 10, and a plate electrode 14 consisting of a 200-nm thick polysilicon film is formed. When a wiring layer (not shown) serving as a bit line is formed on the resultant structure, a dynamic RAM cell is completed.

The capacitance portion is formed by the above method to have a structure in which the n-type diffusion layer 4 and the n⁺-type diffusion layer 11 are integrated into the n⁺-type diffusion layer 20. The charge stored in the storage electrode 10 is transferred from the n⁺-type diffusion layer 20 to the n-type diffusion layer 4 upon ON/OFF operation of the gate electrode 9 of the MOS transistor, thus inputting/outputting data. In this case, since the amount of leakage current in the diffusion layer is reduced to about ⅓ that in the conventional device, the charge holding characteristics of the capacitor are improved about three times. In addition, in this embodiment, the impurity concentration of the n⁺-type diffusion layer 7 is set to be 10 times that of the p⁺-type channel stopper 3. If, however, the impurity concentration of the n⁺-type diffusion layer 7 is at least three times or more that of the p⁺-type channel stopper 3, the above effect can be obtained.

Figure 5:
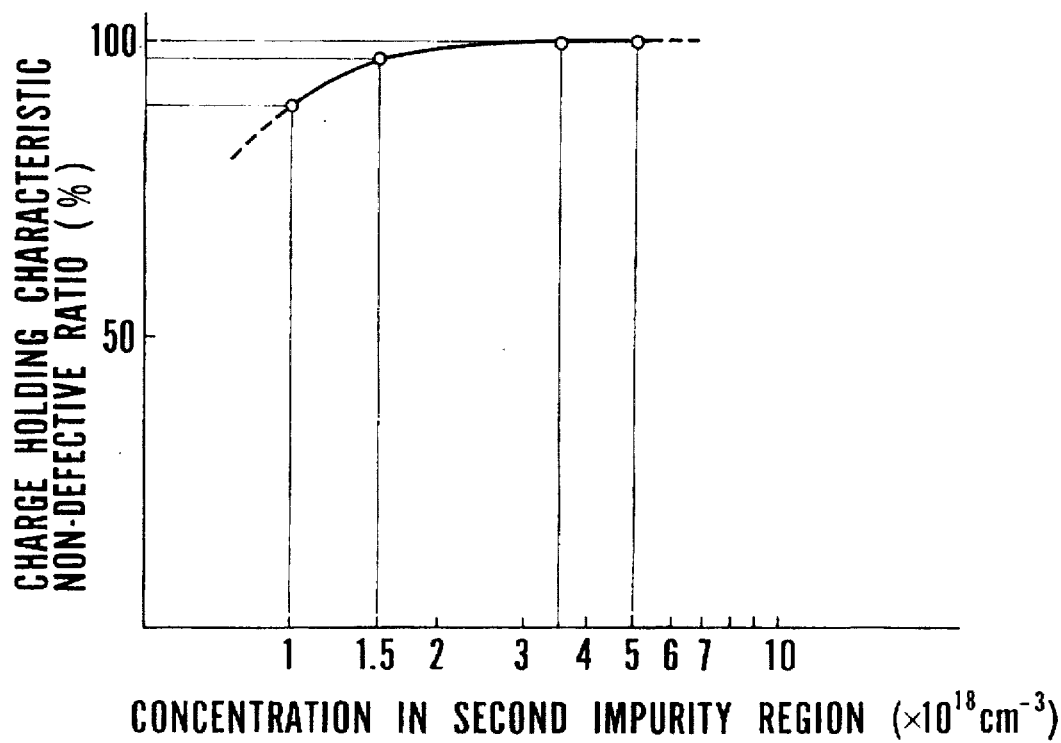
FIG. 5 is a graph showing a charge holding characteristic non-defective ratio (%) with respect to the second impurity concentration when the impurity concentration of a channel stopper is fixed at $5 \times 10^{17}$ cm$^{-3}$.

FIG. 5 shows data for proving that the above effect can be obtained if the impurity concentration of the n⁺-type diffusion layer 7 as the second impurity region is at least three times or more that of the p⁺-type channel stopper 3.

FIG. 5 is a graph showing the charge holding characteristic non-defective ratio (%) with respect to the impurity concentration (1 to $5\times10^{18}$ cm⁻³) of the second impurity region when the impurity concentration of the channel stopper is fixed at $5\times10^{17}$ cm⁻³. Referring to FIG. 5, the abscissa is a log scale, and the ordinate is a linear scale. As is apparent from this graph, when the impurity concentration of the second impurity region is $1\times10^{18}$ cm⁻³ (twice that of the channel stopper), the charge holding characteristic non-defective ratio (%) is about 90%. When the impurity concentration of the second impurity region is $1.5\times10^{18}$ cm⁻³ (three times that of the channel stopper) or more, the charge holding characteristic non-defective ratio (%) is almost 100%. That is, if the impurity concentration of the second impurity region is at least three times or more that of the channel stopper, the number of defective devices becomes 0. Even if the impurity concentration of the second impurity region is about twice that of the channel stopper, the non-defective ratio is 90%. That is, the manufactured devices are not totally inapplicable and may be used for products which do not demand severe charge holding characteristics.

Figure 6A:
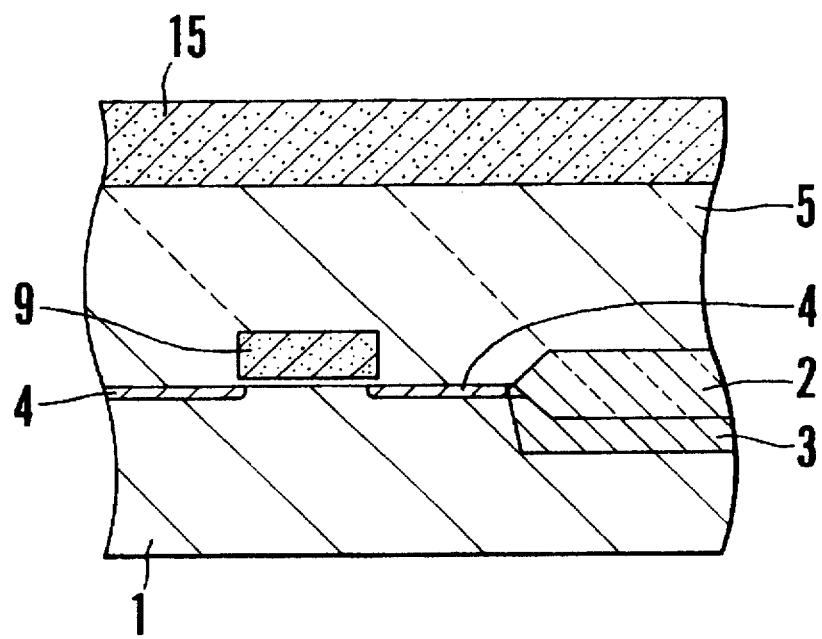
FIGS. 6A to 6F and FIGS. 7A to 7F are partial sectional views respectively showing the steps in manufacturing semiconductor devices according to the second and third embodiments of the present invention.
Figure 6B:
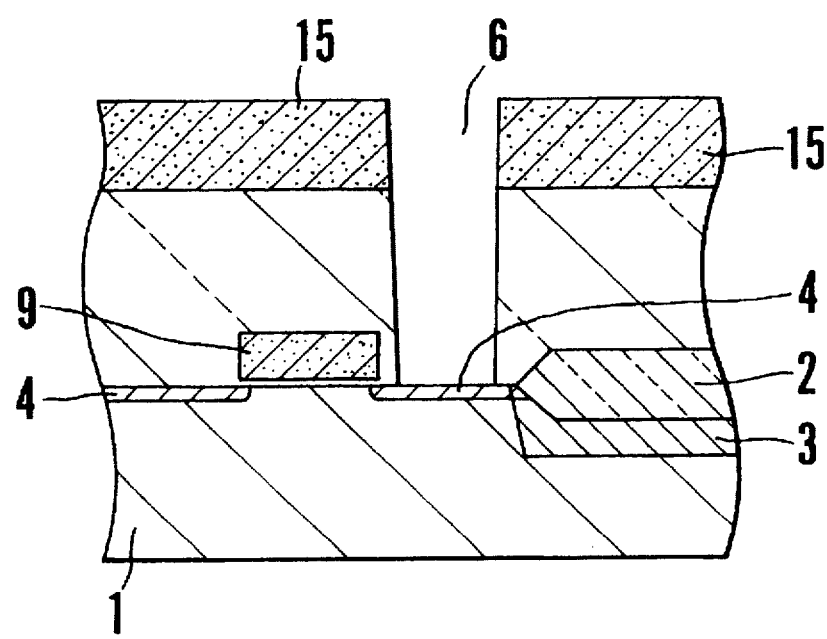
Figure 6C:
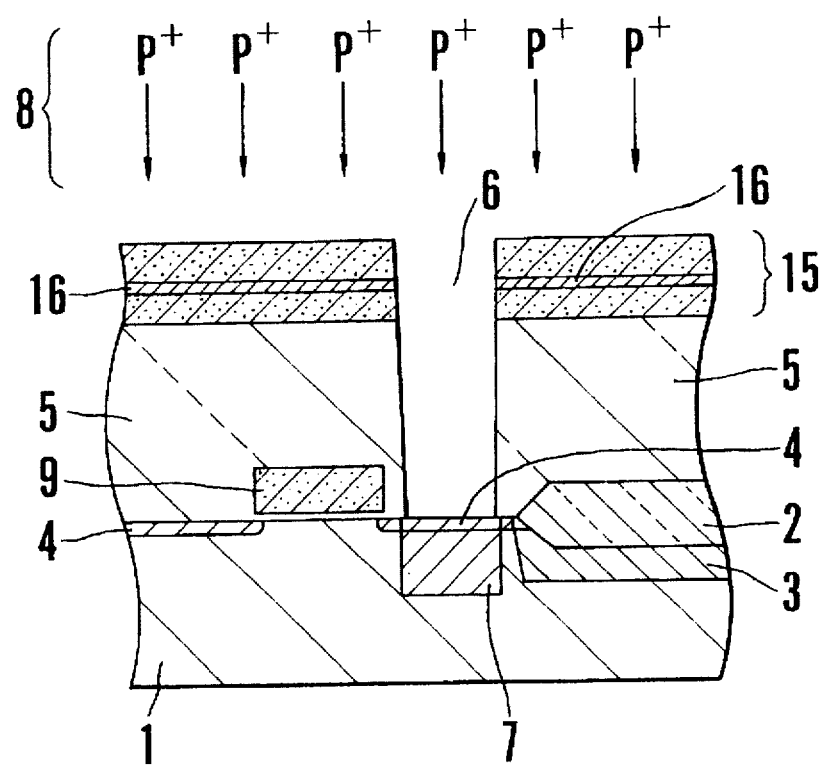
Figure 6D:
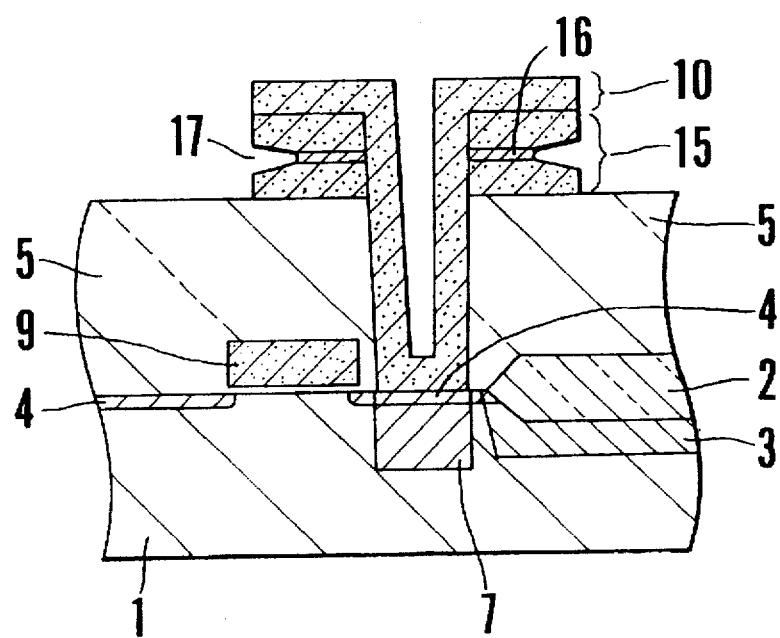
Figure 6E:
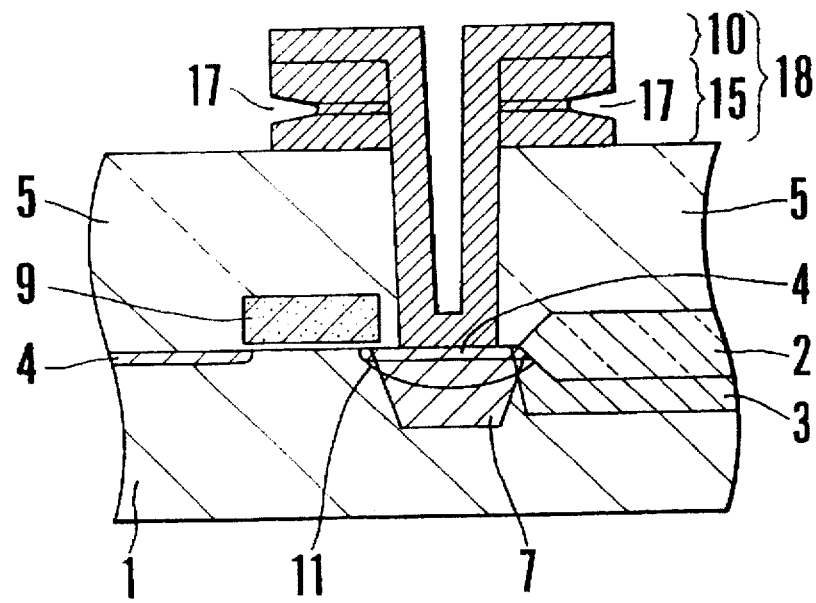
Figure 6F:
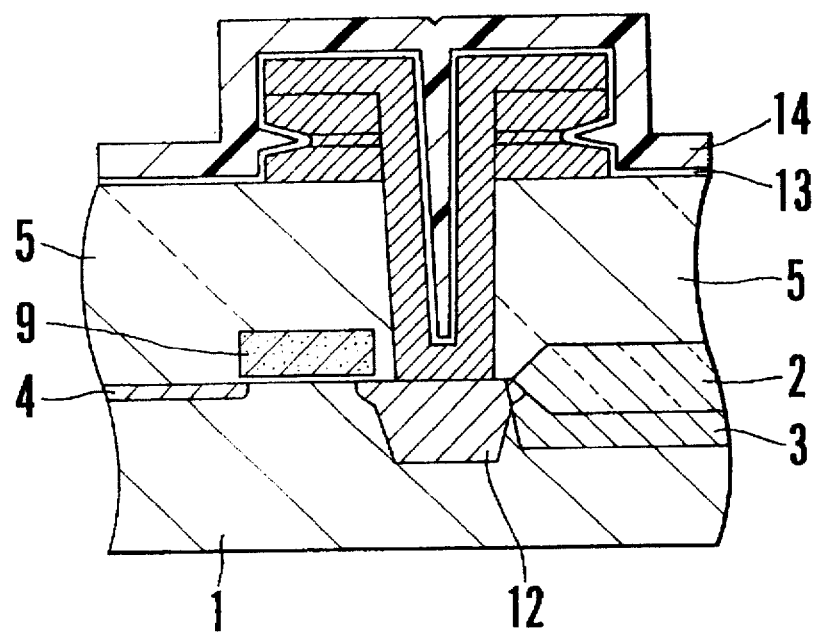

The second embodiment of the present invention will be described next with reference to FIGS. 6A to 6F. FIGS. 6A to 6F are partial sectional views for explaining the second embodiment in the order of the manufacturing process. FIG. 6F is a partial sectional view showing the structure of a completed dynamic RAM cell in the second embodiment. The structure of the dynamic RAM cell of the second embodiment shown in FIG. 6F is the same as that of the first embodiment shown in FIG. 3D except for the structure of the storage electrode, and hence a repetitive description will be avoided. Referring to FIG. 6F, a storage electrode 18 has a multilayered structure consisting of a polysilicon portion 15 and a storage electrode 10. An n⁺-type region 16 as the fourth impurity region is formed in the polysilicon portion 15. The side wall of the polysilicon portion 15 has a wedge-shaped constriction 17. Note that amorphous silicon or the like may be used for the polysilicon portion 15. The second embodiment is characterized by a structure obtained by combining the storage electrode 18 having the wing-like constricted portion 17 with an n⁺-type diffusion layer 12 with a small amount of leakage current.

A method of manufacturing the dynamic RAM cell having the structure in FIG. 6F will be described below. As shown in FIG. 6A, the same steps as those in the first embodiment are performed until a 500-nm thick silicon oxide film is deposited to form an insulating film 5. Thereafter, a polysilicon portion 15 as the second conductive layer is deposited on the insulating film 5 to a thickness of 300 nm. As shown in FIG. 6B, a contact portion 6 is formed to reach an n-type diffusion layer 4. As shown in FIG. 6C, phosphorus ions 8 are implanted into the polysilicon portion 15 and the contact portion 6 to form an $n^+$-type diffusion layer 7 as the second impurity region. At this time, since the phosphorus ions 8 are implanted into the entire surface of the polysilicon portion 15 and the contact portion 6, ions are implanted into the polysilicon portion 15 as well. As a result, an $n^+$-type region 16 is formed in the polysilicon portion 15. In this ion implantation, the implantation energy and the dose are determined to realize an ion implantation depth of about 0.11 µm and a concentration of $5 \times 10^{18}$ cm$^{-3}$. As shown in FIG. 6D, n-type polysilicon is deposited on the entire surfaces of the polysilicon portion 15 and the contact portion 6 to a thickness of 100 nm, and patterning is performed to form a storage electrode 10. In this case, the multilayered film consisting of the storage electrode 10 and the polysilicon portion 15 is subjected to anisotropic etching first, and is then subjected to isotropic etching which has different etching rates based on different impurity concentrations so as to perform side etching of only the $n^+$-type region 16 having a high phosphorus concentration. A storage electrode 18 having the structure shown in FIG. 6E is obtained by this method. After this step, as shown in FIG. 6E, the resultant structure is annealed to thermally diffuse the impurity from the storage electrode 18 consisting of n-type polysilicon into the semiconductor substrate, in which the n-type diffusion layer 4 and the $n^+$-type diffusion layer 7 are formed, via the contact portion 6. With this step, an $n^+$-type diffusion layer 11 is formed. The subsequent steps in this manufacturing method are performed in the same as in the first embodiment to form the dynamic RAM cell shown in FIG. 6F.

If the manufacturing method of the second embodiment described above is used, the storage electrode 18 having the wedge-shaped constriction 17 is formed. With this structure, the storage capacitance increases, and a software error due to α rays does not easily occur. In addition, since the $n^+$-type diffusion layer 12 with a small amount of leakage current is formed in the same manner as described above, a deterioration in charge holding characteristics does not occur. That is, a structure which has the above two advantages can be obtained. Furthermore, this structure having the two advantages can be obtained by almost the same number of manufacturing steps as those of the conventional method.

Figure 7A:
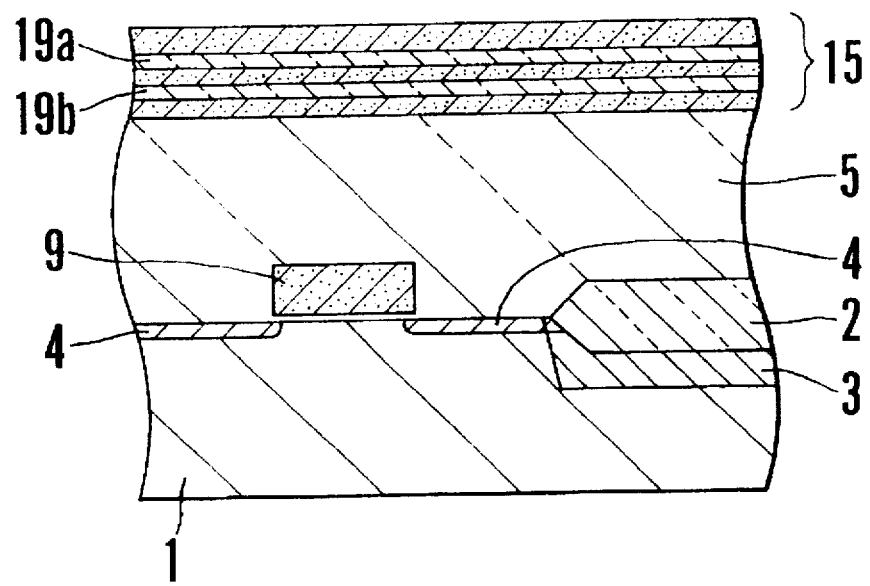
Figure 7B:
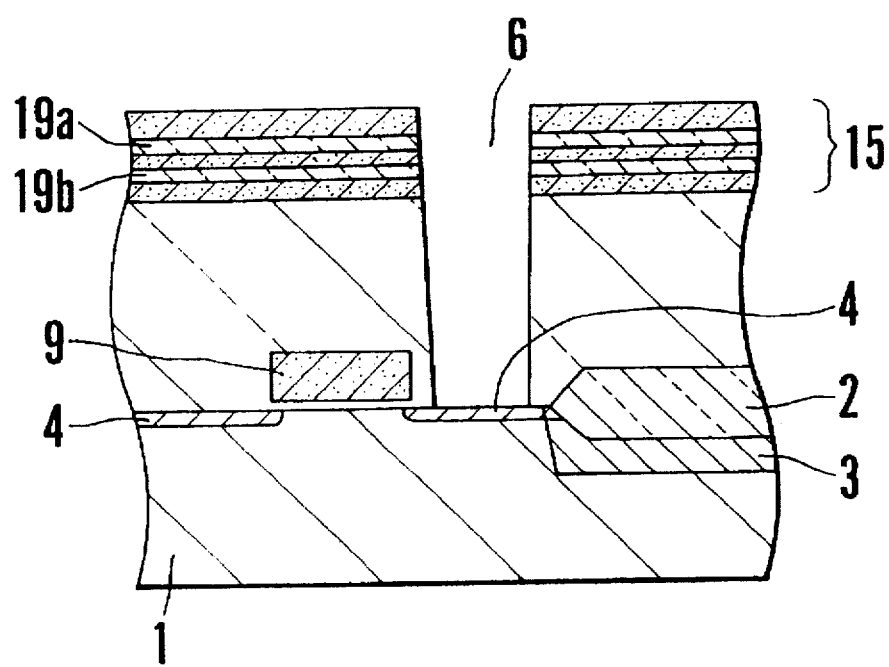
Figure 7C:
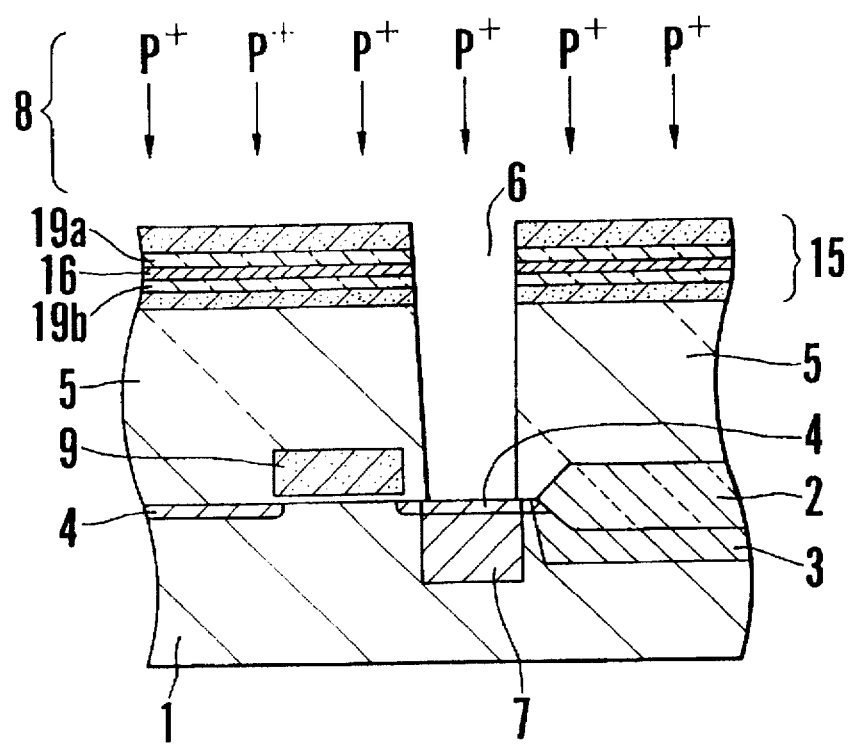
Figure 7D:
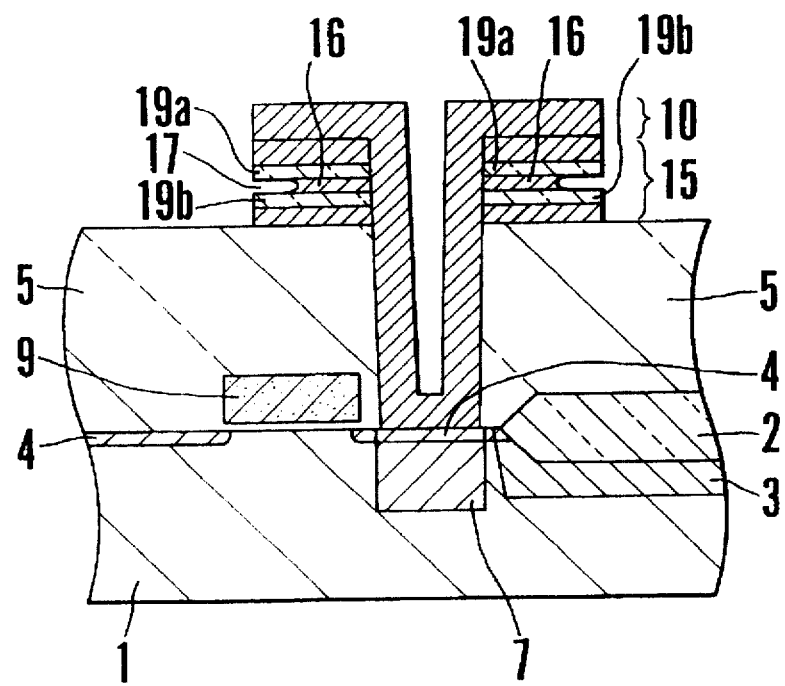
Figure 7E:
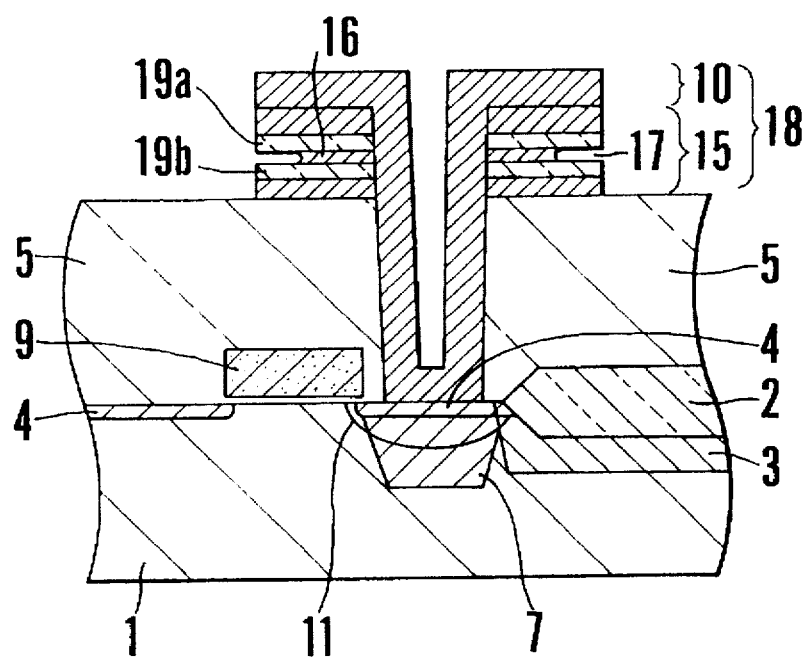
Figure 7F:
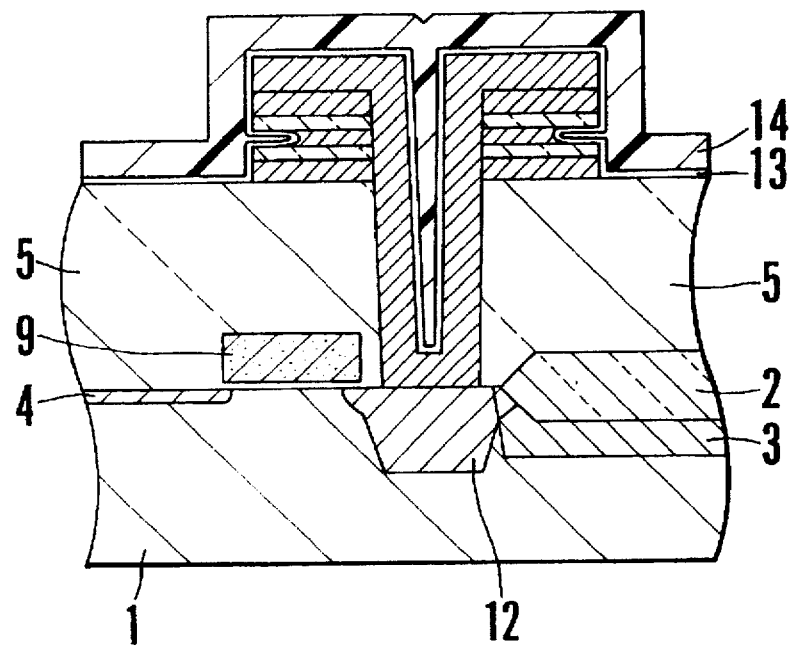

The third embodiment of the present invention will be described in detail next with reference to FIGS. 7A to 7F. FIGS. 7A to 7F are partial sectional views for explaining the third embodiment of the present invention in the order of the manufacturing process. FIG. 7F shows the structure of a completed dynamic RAM cell in the third embodiment. The structure of the dynamic RAM cell of the third embodiment shown in FIG. 7F is the same as that of the second embodiment shown in FIG. 6F except that an oxygen-rich region is formed by mixing oxygen in a deposition reactive gas in depositing a polysilicon portion 15, and hence a repetitive description will be avoided. As shown in FIG. 7A, oxygen is mixed in two deposition regions obtained by depositing a polysilicon portion 15 to thicknesses of about 100 nm and 200 nm to form oxygen-rich regions 19a and 19b. In this case, the oxygen-rich regions 19a and 19b have a thickness of about 15 µm. As shown in FIG. 7B, a contact portion 6 is formed as in the first and second embodiments. Thereafter, similar to the second embodiment, phosphorus ions 8 ($p^+$-type impurity) are implanted into the entire surfaces of the polysilicon portion 15 and the contact portion 6 to form an $n^+$-type diffusion layer 7 and also form an $n^+$-type region 16 in the polysilicon portion 15. At this time, as shown in FIG. 7C, the energy for the above ion implantation is adjusted to form the $n^+$-type region 16 between the oxygen-rich regions 19a and 19b. In this embodiment, the energy is determined to realize an ion implantation depth of about 130 nm. With this structure, the $n^+$-type region 16 does not extend, even if annealing is performed in the next step, because the oxygen-rich regions serve as stoppers for phosphorus diffusion. As a result, a wedge-shaped constriction 17 can be formed more sharply, and hence the surface area of a storage electrode 18 can be increased, as shown in FIGS. 7D to 7F. Therefore, the storage capacity further increases, and characteristics associated with software errors and the like improve. At the same time, an $n^+$-type diffusion layer 12 with a small amount of leakage current can be formed.

As has been described above, according to the present invention, the diffusion layer of the contact portion 6 is formed by using the first impurity region (n-type diffusion layer 4), the second impurity region ($n^+$-type diffusion layer 7), and the third impurity region ($n^+$-type diffusion layer 11). The impurity profile of the second impurity region formed by ion implantation in the direction of depth exhibits a concentration peak at substantially the same depth as that at which the impurity profile of the channel stopper in the direction of depth exhibits a concentration peak. In addition, the impurity concentration of the second impurity region is at least three times or more that of the channel stopper. For this reason, the amount of leakage current in the diffusion layer can be reduced to about ⅓ or less that in the conventional device. When the present invention is applied to a dynamic RAM cell, in particular, the charge holding characteristics of a capacitor can be improved three times or more.

In addition, in the step of forming the second impurity region, the fourth impurity region ($n^+$-type region 16) can be simultaneously formed in the polysilicon portion 15. For this reason, if this structure is used as the storage electrode of a capacitor, the surface area of the storage electrode 18 can be increased by performing etching which has different etching rates based on different impurity concentrations. Therefore, both an increase in storage capacitance and a decrease in the amount of leakage current can be realized.

What is claimed is:

1. A semiconductor device comprising:
 a field insulating film formed on one major surface of a semiconductor substrate of a first conductivity type to surround an element region;
 a channel stopper of the first conductivity type formed immediately below said field insulating film; and
 a diffusion layer of an opposite conductivity type formed to be adjacent to said channel stopper,
 wherein an impurity concentration peak position of said diffusion layer substantially coincides with that of said channel stopper.

2. A device according to claim 1, wherein said semiconductor substrate is formed into a structure having a well formed in one major surface.

3. A semiconductor device comprising:
 an element isolation region formed on one major surface of a semiconductor substrate of a first conductivity type;
 a channel stopper of the first conductivity type formed immediately below said element isolation region;

an element formation region formed to be surrounded by said element isolation region;

a first impurity region formed in said element formation region;

an insulating film formed on the one major surface of said semiconductor substrate;

a contact portion formed to reach said first impurity region;

a second impurity region in a region, on said semiconductor substrate, in which said contact portion is formed;

a first conductive layer connected to said first and second impurity regions and formed in said contact portion; and a third impurity region formed by diffusing an impurity from said first conductive layer into said semiconductor substrate, wherein said first, second, and third impurity regions are adjacent to said channel stopper, and an impurity profile of said second impurity region exhibits a concentration peak at substantially the same depth as that at which an impurity profile of said channel stopper exhibits a concentration peak.

4. A device according to claim 3, wherein an impurity concentration of said second impurity region is at least not less than three times that of said channel stopper.

5. A semiconductor device comprising:

an element isolation region formed on one major surface of a semiconductor substrate of a first conductivity type;

a channel stopper of the first conductivity type formed immediately below said element isolation region;

an element formation region formed to be surrounded by said element isolation region;

a first impurity region formed in said element formation region;

a contact portion formed to reach said first impurity region;

a second impurity region in a region, on said semiconductor substrate, in which said contact portion is formed;

a first conductive layer connected to said first and second impurity regions and formed in said contact portion;

a third impurity region formed by diffusing an impurity from said first conductive layer into said semiconductor substrate;

an insulating film formed on the one major surface of said semiconductor substrate;

a second conductive layer formed on said insulating film; and a fourth impurity region formed in said second conductive layer, wherein said first, second, and third impurity regions are adjacent to said channel stopper, an impurity profile of said second impurity region exhibits a concentration peak at substantially the same depth as that at which an impurity profile of said channel stopper exhibits a concentration peak, and a cross-section of a side wall portion of said second conductive layer has a wedge-shaped constriction shape.

6. A device according to claim 5, wherein an impurity concentration of said second impurity region is at least not less than three times that of said channel stopper.

7. A device according to claim 5, wherein said fourth impurity region formed in said second conductive layer has an oxygen-rich region in at least one of positions immediately above or below said fourth impurity region, and said second conductive layer has a multilayered structure constituted by said fourth impurity region and said oxygen-rich region.

8. A device according to claim 6, wherein said fourth impurity region formed in said second conductive layer has an oxygen-rich region in at least one of positions immediately above or below said fourth impurity region, and said second conductive layer has a multilayered structure constituted by said fourth impurity region and said oxygen-rich region.

* * * * *